US006856503B2

(12) United States Patent
Apfelbacher et al.

(10) Patent No.: US 6,856,503 B2
(45) Date of Patent: Feb. 15, 2005

(54) CONTROL DEVICE

(75) Inventors: Walter Apfelbacher, Freihung (DE); Norbert Reichenbach, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 127 days.

(21) Appl. No.: 10/275,730

(22) PCT Filed: Apr. 25, 2001

(86) PCT No.: PCT/DE01/01567

§ 371 (c)(1), (2), (4) Date: Nov. 8, 2002

(87) PCT Pub. No.: WO01/86681

PCT Pub. Date: Nov. 15, 2001

(65) Prior Publication Data

US 2004/0109293 A1 Jun. 10, 2004

(30) Foreign Application Priority Data

May 8, 2000 (DE) ........................................ 100 22 343

(51) Int. Cl.[7] ............................ H05K 7/20; H02B 1/00

(52) U.S. Cl. ...................... 361/676; 165/80.3; 165/121; 257/719; 257/726; 361/695; 361/704; 361/601; 361/652; 361/622; 361/628; 454/184

(58) Field of Search ............................... 165/80.3, 185, 165/121, 122; 257/718–719, 726–727; 361/601–831; 454/184

(56) References Cited

U.S. PATENT DOCUMENTS

| | | | | |
|---|---|---|---|---|
| 3,769,551 A | * | 10/1973 | Corman et al. | 361/676 |
| 4,060,847 A | * | 11/1977 | Penrod | 361/705 |
| 4,459,638 A | * | 7/1984 | Brehm et al. | 361/697 |
| 4,845,308 A | * | 7/1989 | Womack et al. | 174/15.4 |
| 4,943,890 A | | 7/1990 | Schaltenbrand et al. | |
| 5,297,025 A | * | 3/1994 | Shoquist et al. | 361/704 |
| 5,337,214 A | | 8/1994 | Lindsey et al. | |
| 6,087,800 A | * | 7/2000 | Becker et al. | 318/778 |
| 6,104,602 A | * | 8/2000 | Morris et al. | 361/678 |
| 6,141,206 A | * | 10/2000 | Bruner et al. | 361/605 |
| 6,488,214 B1 | * | 12/2002 | Nicolai et al. | 237/69 |

FOREIGN PATENT DOCUMENTS

| | | |
|---|---|---|
| EP | 0680145 | 11/1995 |
| FR | 2546659 | 11/1984 |

* cited by examiner

*Primary Examiner*—Gregory D. Thompson
(74) *Attorney, Agent, or Firm*—Harness, Dickey & Pierce, P.L.C.

(57) ABSTRACT

A control device is for a commercially available switchgear and an electronic power module. Compactness of the device is improved so that it can be used in a switchgear cabinet. To this end, the power module is placed onto the switchgear on the side facing away from its bottom wall and the dimensions of the power module are adapted to the base contour of the switchgear so that the peripheral contour of the power module extends beyond the base contour only slightly, if at all, wherein at least the width of the contactor does not extend beyond it.

28 Claims, 4 Drawing Sheets

CONTROL DEVICE

This application is the national phase under 35 U.S.C. § 371 of PCT International Application No. PCT/DE01/01567 which has an International filing date of Apr. 25, 2001, which designated the United States of America and which claims priority on German Patent Application number DE 100 22 343.5 filed May 8, 2000, the entire contents of which are hereby incorporated herein by reference.

FIELD OF THE INVENTION

The invention generally relates to a control device with an electromagnetic switchgear apparatus. Preferably, it relates to one having a switchgear apparatus housing with a bottom wall, which is extended for the purpose of fixing the switchgear apparatus and forms the base area of the switchgear apparatus, and with an electronic power module—electrically connected to the switchgear apparatus—with a module housing for the soft starting of a motor or a group of motors. The switchgear apparatus preferably serves as an electrical bridging unit. The electronic power module may be placed onto the switchgear apparatus on its side remote from the bottom wall, with the structural width b of the power module not exceeding the width of the base area of the switchgear apparatus.

BACKGROUND OF THE INVENTION

A control device is known which is constructed from an electronic power module and a separate commercially available switchgear. For the purpose of soft starting and during rotational-speed-controlled operation of a motor, the semiconductor valves of the electronic power module are operated by phase gating control. When the steady-state operation of the motor is reached, the current is taken over by bridging by use of the mechanical switching contact of the switchgear, as is illustrated in a simplified manner in the single-phase electrical circuit according to FIG. 1.

Significantly smaller losses arise compared with electronic motor control units without bridging. In the steady-state ON operating state, the losses of a switchgear amount to approximately 1/10 of the losses of power semiconductors. Through suitable driving of switchgear and electronic power part by the control unit of the electronic power part during the transition from rotational-speed-controlled operation to steady-state operation, from steady-state operation to rotational-speed-controlled operation and from steady-state operation to the OFF state, the arc loading on the switchgear contacts can be restricted to a minimum amount and the switching lifetime of the contacts can thus be increased to the region of the mechanical switching lifetime of the switchgear.

The known control devices are constructed in accordance with FIG. 2 with a commercially available switchgear and an electronic power module arranged alongside as separate components which are electrically interconnected.

EP 0 860 145 B1 discloses a control device of the type mentioned above. In the case of this control device, the semiconductors are driven in such a way that only a minimal voltage occurs at the mechanical switching contacts during the very short switch-on and -off phases. This considerably prolongs the electrical lifetime of the switching contacts. The duration of the switch-on and -off phases is very short, i.e. only a few power supply periods, so that likewise only very little power loss arises in the semiconductors. In a motor control unit, however, starting and stopping operations occur which can last from a few seconds to a few minutes. During these control operations, exclusively the semiconductor elements are in use, with the consequence of correspondingly high losses which must be dissipated by means of suitable cooling measures.

SUMMARY OF THE INVENTION

Therefore, an embodiment of the invention can be based on an object of providing a control device with a commercially available switchgear apparatus and an electronic power module, which is suitable for relatively lengthy starting and stopping operations.

The arrangement of the electronic power module on the switchgear affords an advantage, in the case of mounting in a switchgear cabinet in one embodiment, that the heat loss generated by the electronic power module can be dissipated well and without influencing other apparatuses. By virtue of the internal space of the module housing having three mutually insulated chambers in one embodiment, in each of which an electronic switching unit is arranged, the situation where a fault in one electronic switching unit spreads to an adjacent electronic switching unit may be avoided in this way.

An advantageous embodiment of the control device according to the invention exists if the control device is embodied as a motor control unit encapsulated toward the outside by the switchgear apparatus housing and the module housing, and if only connecting rails of the electronic power module and connection rails of the switchgear apparatus are accessible externally. Depending on the embodiment, the connecting rails of the electronic power module or the connection rails of the switchgear apparatus or else both can be used for the connection of the control device. The pitch of the connection rails of the switchgear apparatus is maintained as a result of this, which makes it possible to replace the switchgear apparatus by the higher-quality control device.

This embodiment advantageously corresponds to the type that is customary in electrical switchgear apparatuses, in particular switchgears, where only the connection rails are externally accessible.

If the electronic power module is placed onto the switchgear apparatus housing in a positively locking manner, then the positively locking connection already results in a fixed mechanical connection between both components, so that additional connecting devices that are costly and complicated in terms of mounting remain obviated.

A further advantageous embodiment of the invention exists if the connecting rails of the electronic power module and the connection rails of the switchgear apparatus serve for electrically and mechanically connecting both components.

With regard to the arrangement of the electronic switching units and their connection to the connection rails of the switchgear apparatus, it is advantageous if these are arranged according to a pitch and the position of the chambers is adapted thereto.

Furthermore, it is advantageous if the electronic switching units each have semiconductor cells which are electrically connected back-to-back and are clamped in between two metal plates of high thermal conductivity, since, in the case of this embodiment, the metal rails serve not only for current transmission, but also for heat dissipation.

An additional improvement in the heat dissipation is achieved if the connecting rails have a high thermal conductivity.

The measures described for dissipating the heat loss as optimally as possible enable the components of the electronic power module to be arranged correspondingly compactly.

BRIEF DESCRIPTION OF THE DRAWINGS

An exemplary embodiment of the invention is explained in more detail below with reference to the drawings, in which.

DETAILED DESCRIPTION OF THE PREFERRED EMBODIMENTS

Figure 3:
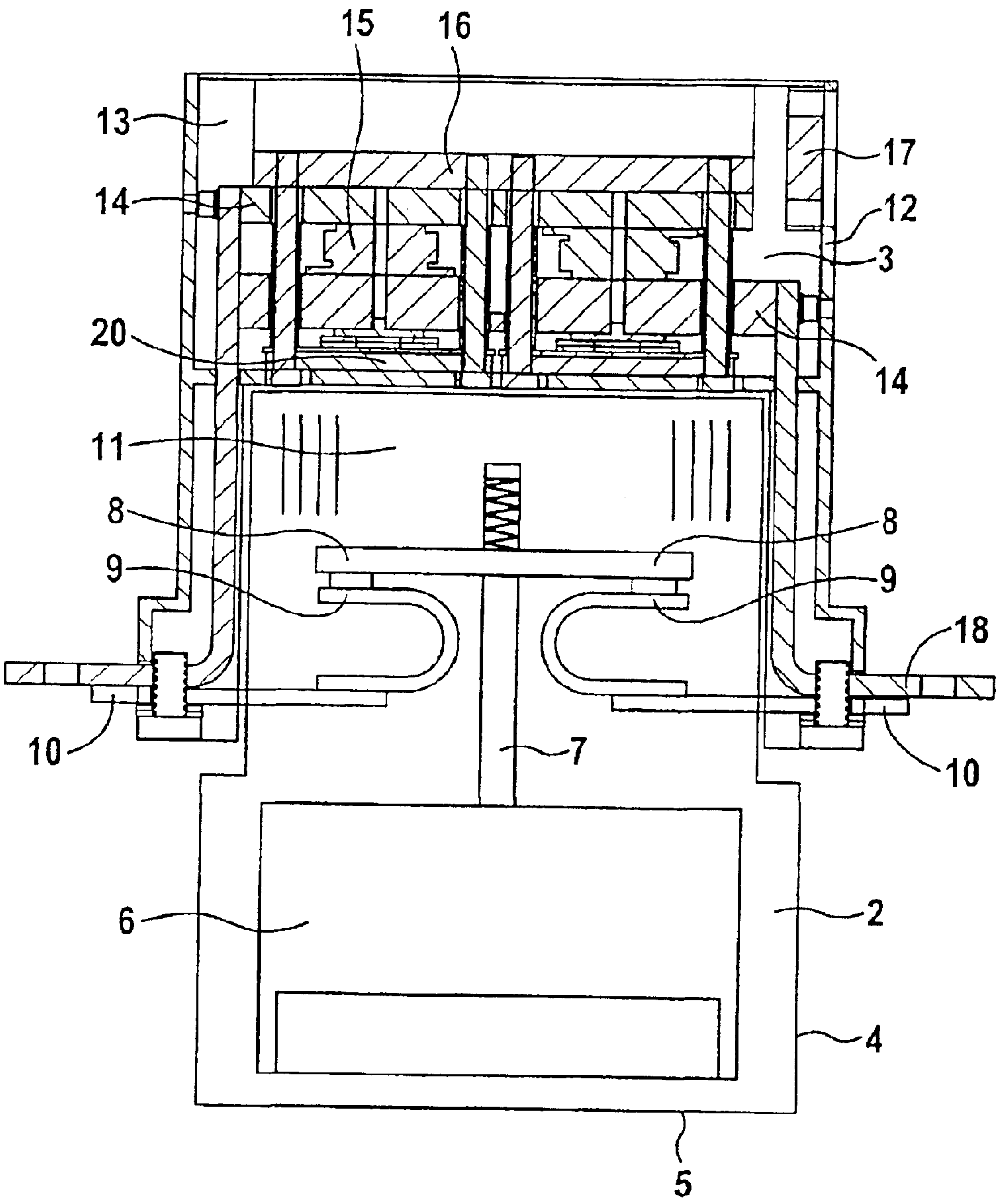
FIG. 3 shows a sectional view of the control device according to an embodiment of the invention.

The sectional view of the control device 1 according to an embodiment of the invention in accordance with FIG. 3 shows a commercially available switchgear 2 with a power module 3 placed thereon, e.g. for the soft starting of a motor or a group of motors. The control device can also be operated in the application as a hybrid switchgear. The switchgear 2 is an electromagnetic switchgear apparatus with a switchgear apparatus housing 4 having a bottom wall 5, which, in its extended region, is provided with bored holes (not illustrated here) for attaching the switchgear 2.

In the internal space of the switchgear 2, an electromagnetic system 6 is arranged on the bottom wall 5, the armature of which system is connected to a contact carrier 7, via which movable contacts 8 can be connected to fixed contacts 9. The switchgear 2 is connected via connection rails 10 which are accessible outside the switchgear apparatus housing 4 and are electrically connected to the fixed contacts 9. The contact system 8, 9 is accommodated in a switching chamber 11, which lies in the upper region of the switchgear 2, with arc runner plates (not illustrated here).

The electronic power module 3 with its module housing 12 is placed onto the switchgear 2, on its side remote from the bottom wall 5. The internal space of the module housing 12 includes three chambers 13, in each of which is situated an electronic switching unit for in each case one of the three electrical phases of the three-phase system used for supply purposes. The electronic switching units are constructed in a sandwich design with two copper plates 14 which are arranged parallel and between which two power semiconductors 15 which are electrically connected back-to-back are clamped in by use of a clamping-in device 20. The upper copper plate 14 is fixedly connected to a heat sink 16 whilst complying with a minimum heat transfer resistance. Heat is dissipated via fans 17 fitted laterally to the module housing 12 of each chamber 13.

Connected to each of the copper plates 14 is an L-shaped connecting rail 18 which is routed in the inter-space between the switchgear apparatus housing 4 and the module housing 12 and bears in a planar manner on one of the two connection rails 10 of the switchgear 2. The connecting rails 18 are composed of material that conducts heat well, as a result of which the continuous current-carrying capacity of the switchgear 2 is increased.

Depending on the embodiment, the connecting rails 18 of the electronic power module or the connection rails 10 of the switchgear apparatus, or both, can be used for the connection of the control device. The pitch of the connection rails of the switchgear apparatus is maintained as a result of this, which makes it possible to replace the switchgear apparatus by the higher-quality control device.

Figure 4:
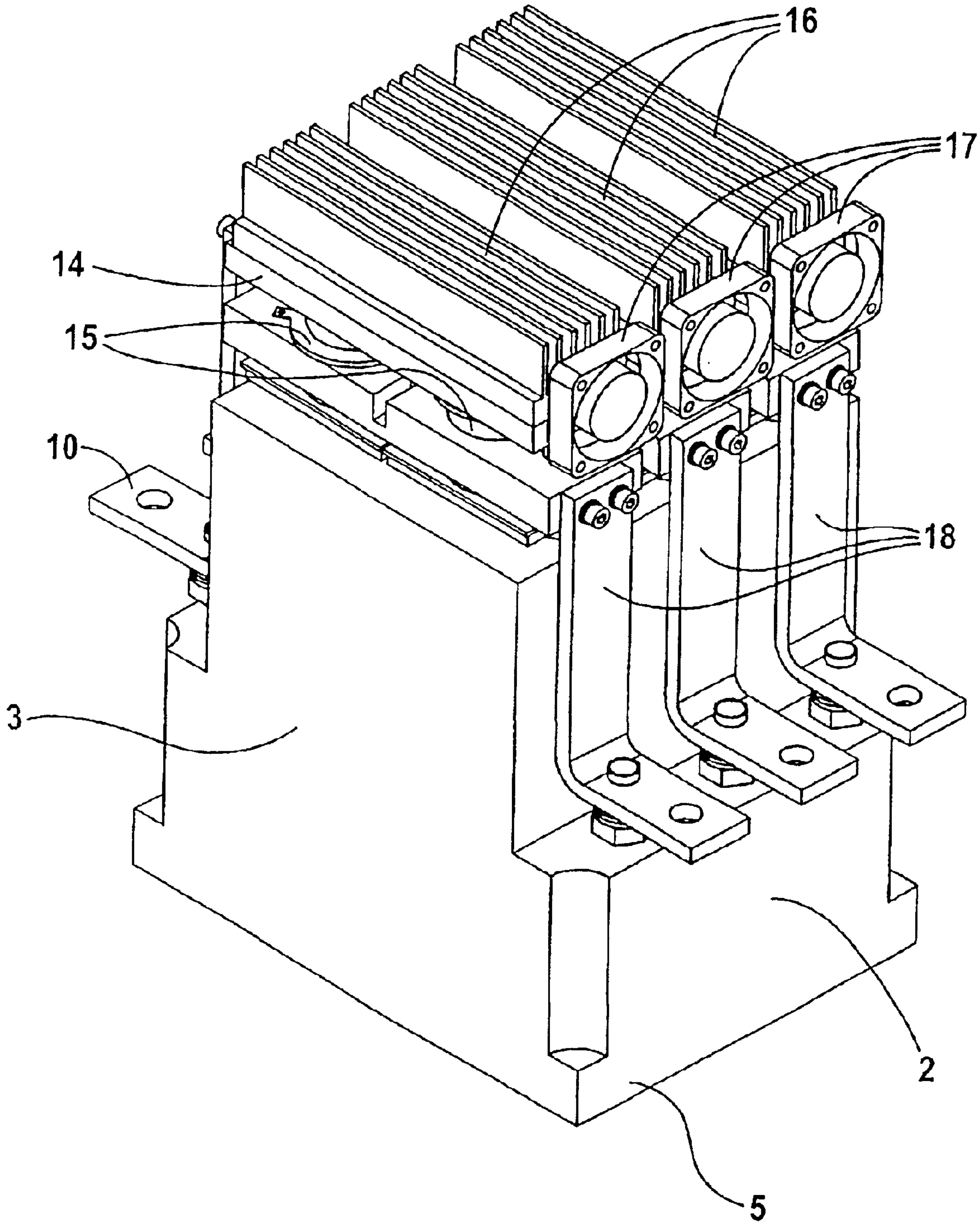
FIG. 4 shows a perspective view of a control device according to an embodiment of the invention in three-phase construction with the module housing removed.
Figure 5:
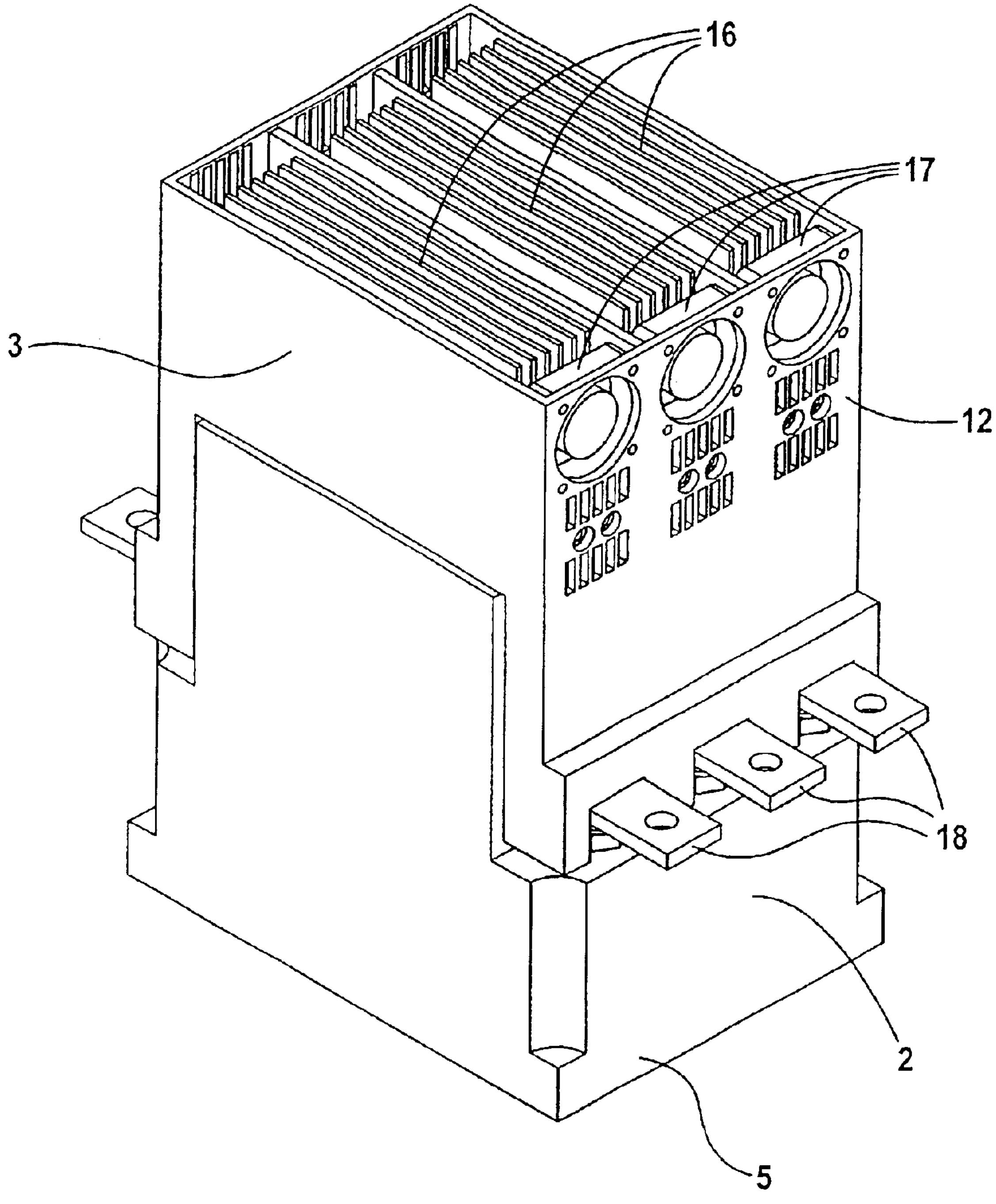
FIG. 5 shows a perspective view of a control device according to an embodiment of the invention with the cover removed.

FIGS. 4 and 5 each show a perspective view of the control device 1 according to an embodiment of the invention in a compact design, the module housing 12 being removed in FIG. 4 and only the cover of the module housing 12 being removed in FIG. 5.

The compact construction of the control device 1 according to an embodiment of the invention becomes possible essentially by virtue of the fact that the power loss of the electronic switching units is avoided in continuous operation. For this purpose, the electronic switching units are bridged by the contacts 8, 9 of the switchgear 2 (FIG. 3).

For starting and rotational-speed-controlled operation, the electronic power semiconductors 15 (FIG. 3) undertake the switching task as switching elements, while only the switchgear 2 (FIG. 3) carries the current in continuous operation. The starting loading during a soft start is determined by the starting current and the starting duration. In comparison with electronic motor control units without bridging, significantly smaller losses arise in the case of the present control device, since the losses of the switchgear 2 in the steady-state ON operating state amount to only 1/10 of the losses of power semiconductors.

Figure 1:
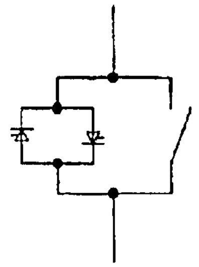
FIG. 1 shows a single-phase electrical circuit for illustrating a method of operation of a control device.
Figure 2:
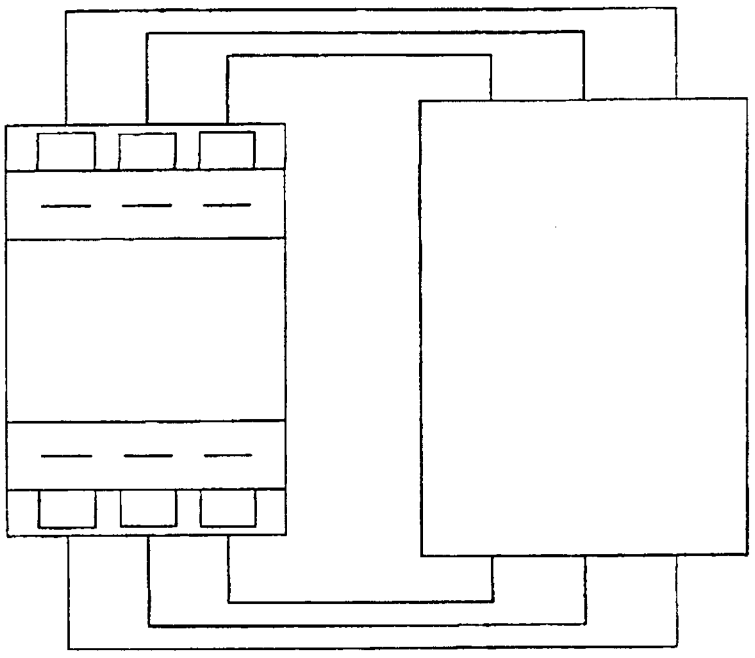
FIG. 2 shows a known arrangement comprising a three-phase switchgear and a separate electronic soft-start apparatus.
Figure 6:
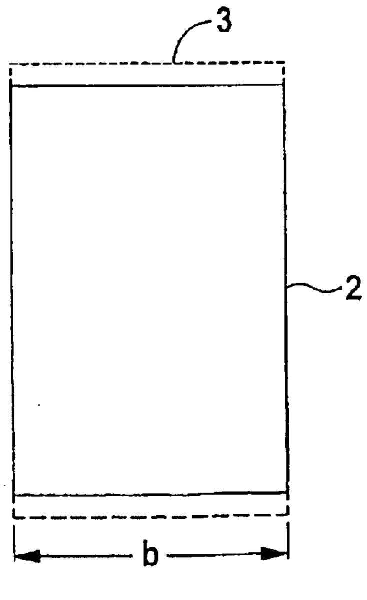
FIG. 6 shows, by way of example, the base area contour and peripheral contour in plan view of a control device according to FIGS. 3,4,5.

The above-described compact construction of the motor device with the electronic power module placed onto the switchgear represents an optimization of the structural volume, in which its peripheral contour does not at any point exceed the base area contour of the switchgear 2 by more than 30% and/or its width does not exceed the width b of the switchgear 2. This is illustrated with reference to FIG. 6, which represents the base area contour of the switchgear 2 by the solid line and the peripheral contour of the electronic power module 3 by the broken line.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A control device with an electromagnetic switchgear apparatus, comprising:

a switchgear apparatus housing, including a bottom wall forming a base area of the switchgear apparatus; and an electronic power module, electrically connected to the switchgear apparatus and including a module housing, wherein the switchgear apparatus serves as an electrical bridging unit, wherein the electronic power module is placed onto the switchgear apparatus on its side remote from the bottom wall, wherein a structural width of the power module does not exceed a width of the base area of the switchgear apparatus, wherein an internal space of the module housing includes three mutually insulated chambers, each with an electronic switching unit arranged therein, wherein the electronic switching units each include power semiconductors electrically connected back-to-back, clamped between two metal plates of relatively high thermal conductivity, with one of the metal plates being connected to a heat sink, and wherein a fan is arranged in each of the three chambers.

2. The control device as claimed in claim 1, wherein the control device is embodied as a motor control unit encapsulated toward the outside by the switchgear apparatus housing and the module housing, and wherein only connecting rails of the electronic power module and connection rails of the switchgear apparatus are accessible externally.

3. The control device as claimed in claim 1, wherein the electronic power module is placed onto the switchgear apparatus housing in a positively locking manner.

4. The control device as claimed in claim 1, wherein connecting rails of the electronic power module and connection rails of the switchgear apparatus serve for electrically and mechanically connecting both components.

5. The control device as claimed in claim 1, wherein connecting rails of the electronic power module are arranged according to a pitch of the switchgear apparatus and the position of the chambers is adapted thereto.

6. The control device as claimed in claim 2, wherein the connecting rails have a relatively high thermal conductivity.

7. The control device as claimed in claim 1, wherein the electronic power module is for soft starting of at least one motor.

8. A motor control unit comprising the control device as claimed in claim 1, wherein the motor control unit is encapsulated toward the outside by the switchgear apparatus housing and the module housing, and wherein only connecting rails of the electronic power module and connection rails of the switchgear apparatus are accessible externally.

9. The control device as claimed in claim 2, wherein the electronic power module is placed onto the switchgear apparatus housing in a positively locking manner.

10. The control device as claimed in claim 2, wherein the connecting rails of the electronic power module and the connection rails of the switchgear apparatus serve for electrically and mechanically connecting both components.

11. The control device as claimed in claim 2, wherein the connecting rails of the electronic power module are arranged according to a pitch of the switchgear apparatus and the position of the chambers is adapted thereto.

12. The control device as claimed in claim 4, wherein the connecting rails of the electronic power module are arranged according to a pitch of the switchgear apparatus and the position of the chambers is adapted thereto.

13. The control device as claimed in claim 4, wherein the connecting rails have a relatively high thermal conductivity.

14. The control device as claimed in claim 5, wherein the connecting rails have a relatively high thermal conductivity.

15. The control device as claimed in claim 1, wherein the electromagnetic switchgear apparatus includes hybrid switchgear.

16. The control device as claimed in claim 1, wherein the electromagnetic switchgear apparatus is attached to the switchgear housing.

17. The control device as claimed in claim 1, wherein the electronic switching units are constructed in a sandwich design, with the two metal plates being two copper plates arranged in parallel, between which are clamped the power semiconductors, electrically connected back-to-back.

18. A control device with an electromagnetic switchgear apparatus, comprising:

a switchgear apparatus housing, including a bottom wall forming a base area of the switchgear apparatus; and a power module, electrically connected to the switchgear apparatus and including a module housing, wherein the power module resides on the switchgear apparatus on its side remote from the bottom wall, wherein a structural width of the power module does not exceed a width of the base area of the switchgear apparatus, wherein an internal space of the module housing includes a plurality of mutually insulated chambers, each including a fan and an electronic switching unit, wherein at least one of the electronic switching units include power semiconductors clamped in between a plurality of metal plates of relatively high thermal conductivity, and wherein at least one of the metal plates is connected to a heat sink.

19. The control device as claimed in claim 18, wherein the control device is embodied as a motor control unit encapsulated toward the outside by the switchgear apparatus housing and the module housing, and wherein only at least one of connecting rails of the power module and connection rails of the switchgear apparatus are accessible externally.

20. The control device as claimed in claim 18, wherein the power module is placed onto the switchgear apparatus housing in a positively locking manner.

21. The control device as claimed in claim 18, wherein connecting rails of the power module and connection rails of the switchgear apparatus serve for electrically and mechanically connecting both components.

22. The control device as claimed in claim 18, wherein connecting rails of the power module are arranged according to a pitch of the switchgear apparatus and the position of the chambers is adapted thereto.

23. The control device as claimed in claim 19, wherein the connecting rails have a relatively high thermal conductivity.

24. The control device as claimed in claim 18, wherein the power module is for soft starting of at least one motor.

25. A motor control unit comprising the control device as claimed in claim 18, wherein the motor control unit is encapsulated toward the outside by the switchgear apparatus housing and the module housing, and wherein only connecting rails of the power module and connection rails of the switchgear apparatus are accessible externally.

26. The control device as claimed in claim 18, wherein the electromagnetic switchgear apparatus includes hybrid switchgear.

27. The control device as claimed in claim 18, wherein the electromagnetic switchgear apparatus is attached to the switchgear housing.

28. The control device as claimed in claim 18, wherein the electronic switching units are constructed in a sandwich design, with the plurality of metal plates being two copper plates arranged in parallel, between which are clamped the power semiconductors, electrically connected back-to-back.

* * * * *